United States Patent
Kammler et al.

(10) Patent No.: US 8,053,273 B2
(45) Date of Patent: Nov. 8, 2011

(54) SHALLOW PN JUNCTION FORMED BY IN SITU DOPING DURING SELECTIVE GROWTH OF AN EMBEDDED SEMICONDUCTOR ALLOY BY A CYCLIC GROWTH/ETCH DEPOSITION PROCESS

(75) Inventors: Thorsten Kammler, Ottendorf-Okrilla (DE); Andy Wei, Dresden (DE); Ina Ostermay, Coswig (DE)

(73) Assignee: Advanced Micro Devices Inc., Austin, TX (US)

( * ) Notice: Subject to any disclaimer, the term of this patent is extended or adjusted under 35 U.S.C. 154(b) by 111 days.

(21) Appl. No.: 12/504,758

(22) Filed: Jul. 17, 2009

(65) Prior Publication Data
US 2010/0025779 A1 Feb. 4, 2010

(30) Foreign Application Priority Data
Jul. 31, 2008 (DE) .......................... 10 2008 035 812

(51) Int. Cl.
*H01L 21/00* (2006.01)
(52) U.S. Cl. .................. 438/99; 438/758; 257/E51.04
(58) Field of Classification Search .................. 438/99, 438/758; 257/40, E51.04; 977/742
See application file for complete search history.

(56) References Cited

U.S. PATENT DOCUMENTS

| 7,238,561 B2 * | 7/2007 | Zhang et al. ................... 438/197 |
| 2006/0172511 A1 * | 8/2006 | Kammler et al. ............. 438/481 |
| 2007/0032003 A1 * | 2/2007 | Zhang et al. ................... 438/197 |
| 2007/0254421 A1 * | 11/2007 | Tsai et al. ....................... 438/197 |
| 2009/0302348 A1 * | 12/2009 | Adam et al. ................... 257/190 |

FOREIGN PATENT DOCUMENTS
DE 102008047127 A1 12/2009

OTHER PUBLICATIONS

Translation of Official Communication from German Patent Office for German Patent Application No. 10 2008 035 812.6-33 dated Aug. 10, 2010.

* cited by examiner

*Primary Examiner* — Fernando L Toledo
(74) *Attorney, Agent, or Firm* — Williams, Morgan & Amerson (57) ABSTRACT

A silicon/carbon alloy may be formed in drain and source regions, wherein another portion may be provided as an in situ doped material with a reduced offset with respect to the gate electrode material. For this purpose, in one illustrative embodiment, a cyclic epitaxial growth process including a plurality of growth/etch cycles may be used at low temperatures in an ultra-high vacuum ambient, thereby obtaining a substantially bottom to top fill behavior.

19 Claims, 9 Drawing Sheets

SHALLOW PN JUNCTION FORMED BY IN SITU DOPING DURING SELECTIVE GROWTH OF AN EMBEDDED SEMICONDUCTOR ALLOY BY A CYCLIC GROWTH/ETCH DEPOSITION PROCESS

BACKGROUND OF THE INVENTION

1. Field of the Invention

Generally, the subject matter disclosed herein relates to integrated circuits, and, more particularly, to transistors having strained channel regions by using an embedded strained semiconductor material within the active region to enhance charge carrier mobility in the channel region of a MOS transistor.

2. Description of the Related Art

Modern integrated circuits typically comprise a great number of circuit elements on a given chip area, which are positioned and connected to each other according to a specified circuit layout. Transistors as active elements, i.e., as circuit elements enabling signal amplification and signal switching, represent one of the dominant components of an integrated circuit, and therefore the overall performance of integrated circuits is significantly determined by the performance characteristics of the individual transistor elements. The operational behavior of the transistors in turn may depend on the overall dimensions, the basic transistor configuration, the manufacturing techniques used and the like. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of field effect transistors, i.e., N-channel transistors and P-channel transistors, are formed on a substrate including a crystalline semiconductor layer. A MOS transistor or field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region per unit length substantially determines the performance of the MOS transistors. Thus, the reduction of the channel length, and associated therewith the reduction of the channel resistivity per unit length in the transistor width direction, renders the channel length a dominant design criterion for accomplishing an increase in the operating speed of the individual transistors and thus of the entire integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, for example, for compensating for short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, for a standard crystallographic orientation of the basic silicon layer, compressive strain in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source extension regions of the PMOS transistors are formed on the basis of ion implantation. Thereafter, respective sidewall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, a highly in situ doped or an intrinsic silicon/germanium layer is selectively formed in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein. This integration scenario results in a significant performance gain of the P-channel transistors. Hence, a similar concept has been proposed for N-channel transistors by using a silicon/carbon material that has a smaller lattice spacing compared to silicon.

Although the incorporation of a silicon/carbon alloy may be a promising approach for enhancing performance of N-channel transistors on the basis of an embedded strain-inducing semiconductor material, conventional techniques may result in a less pronounced performance gain for transistor architectures requiring shallow drain and source regions, at least in the vicinity of the channel region. That is, the incorporation of the required dopant species by ion implantation may result in significant lattice damage, which may result in a significantly reduced strained lattice after re-crystallization on the basis of anneal processes, since a significantly reduced degree of carbon atoms may be positioned at the lattice sites. Consequently, forming the shallow drain and source regions, which may also be referred to as extension regions, by ion implantation may result in a significantly reduced strain component in the adjacent silicon channel region. On the other hand, the incorporation of the dopant species during the epitaxial growth process according to well-established conventional deposition techniques may lead to a reduced strain-inducing mechanism caused by a shallow cavity or an increased offset of the shallow in situ doped drain and source extension regions, as will be explained in more detail with reference to FIGS. 1a-1b.

Figure 1A:
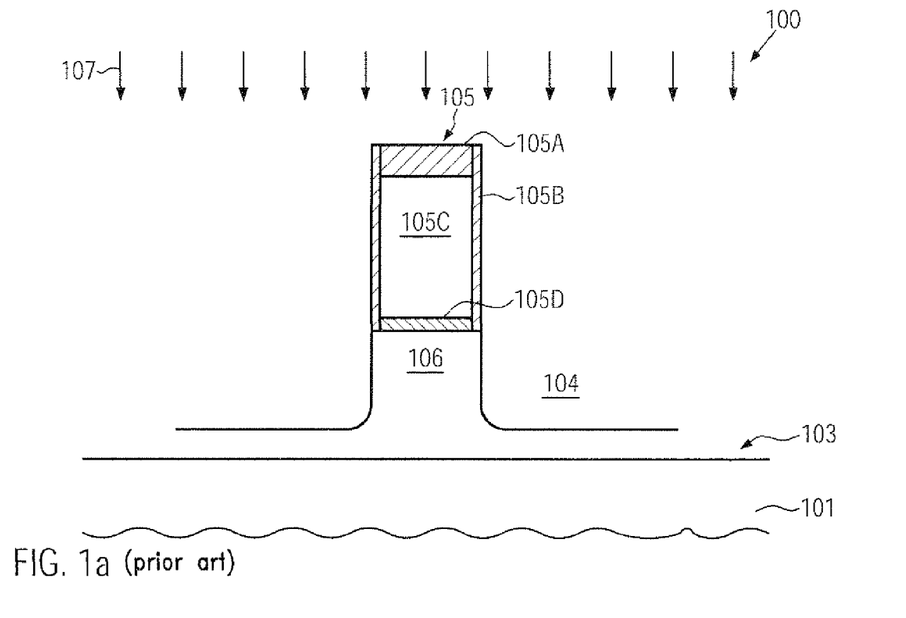
FIGS. 1a-1b schematically illustrate cross-sectional views of a transistor device during a manufacturing sequence for forming the silicon/carbon alloy adjacent to a silicon-containing channel region according to conventional strategies by using selective epitaxial growth techniques.

FIG. 1a schematically illustrates a cross-sectional view of an advanced transistor element 100 at an early manufacturing stage when providing a silicon/carbon semiconductor alloy adjacent to a silicon-containing channel region. The transistor 100 may comprise a substrate 101, which may typically represent a silicon material, possibly in combination with a buried insulating material (not shown), above which is formed a silicon layer 103. Furthermore, the transistor 100 may comprise a gate electrode structure 105, which may comprise, in this manufacturing stage, a gate electrode material 105C formed on a gate insulation layer 105D, which separates the gate electrode material 105C from a channel region 106 of the transistor 100. Moreover, the gate electrode structure 105 comprises a silicon nitride cap layer 105A and a sidewall spacer structure 105B, for instance comprised of silicon nitride. Furthermore, the transistor 100 is exposed to an etch ambient 107, the process parameters of which may be adjusted so as to obtain a substantially anisotropic etch behavior for forming cavities 104 laterally adjacent to the gate electrode structure 105. Generally, a lateral offset of the cavities 104 from the gate electrode material 105C may be determined by the width of the spacer structure 105B and the parameters of the etch process 107. Generally, selecting a moderately small lateral offset may be advantageous with respect to closely positioning a strain-inducing semiconductor alloy to the channel region 106. Furthermore, a depth of the cavity 104 may also have a significant influence on the overall performance gain obtained by the strain-inducing silicon/carbon material to be filled into the cavities 104 in a later manufacturing stage. That is, providing an increased depth for the cavities 104 may result in an overall increased strain component in the channel region 106 for a given composition of the silicon/carbon material to be filled in.

Figure 1B:
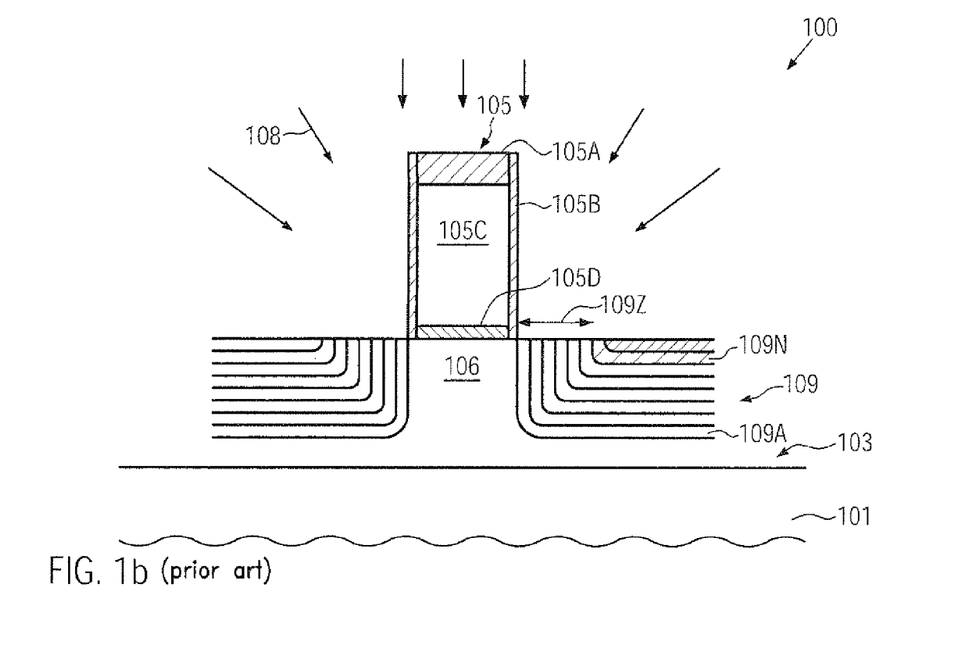

FIG. 1b schematically illustrates the transistor 100 in a further advanced manufacturing stage. As shown, the transistor 100 is exposed to a deposition ambient 108, in which process parameters, such as carrier gas flow rate, precursor gas flow rate, pressure, temperature and the like, are selected such that the silicon/carbon material may preferably be deposited on exposed crystalline silicon areas, while a significant deposition of silicon/carbon material on other areas, such as the cap layer 105A and the spacer structure 105B may be significantly reduced. A corresponding well-established deposition process may frequently be referred to as a selective epitaxial growth technique, in which a crystal structure may grow on exposed surface portions of the silicon layer 103, which may act as a template material for the crystalline growth of the silicon/carbon material. During the selective epitaxial growth process 108 according to conventional strategies, the deposition of the silicon/carbon material may occur in a substantially "conformal" manner, thereby forming layer after layer, as is indicated in FIG. 1b, in which a strained silicon carbon material 109 may be considered as being grown in the form of a plurality of individual sub-layers 109A . . . 109N. Hence, a similar growth rate may occur in the horizontal and vertical directions during the deposition of the silicon/carbon material 109.

The transistor 100 as shown in FIGS. 1a-1b may be formed on the basis of well-established process techniques, which may involve the formation of a gate insulation material followed by the deposition of an appropriate gate electrode material, such as the materials 105D, 105C, possibly in combination with the deposition of the cap layer 105A. Thereafter, these material layers may be patterned on the basis of sophisticated photolithography and etch techniques. Next, the spacer structure 105B may be formed by depositing a silicon nitride material and anisotropically etching the same in order to obtain the structure 105B as shown. Thereafter, the etch process 107 may be performed by using appropriate process parameters, as previously discussed, in order to obtain the cavities 104 extending down to a specified depth. Thereafter, appropriate cleaning recipes may be used, for instance on the basis of well-established wet chemical chemistries, in order to remove contaminants created during the preceding manufacturing steps. Thereafter, the deposition process 108 may be performed by using appropriate process parameters as discussed above, thereby forming the silicon/carbon material 109. As previously indicated, the deposition behavior during the process 108 may substantially not allow the desired high degree of flexibility in designing the overall transistor characteristics of the device 100. That is, if an overall high strain component may be desired in the channel region 106, the cavity 104 has to be formed to extend deep into the semiconductor layer 103 so as to obtain a moderately large amount of strain-inducing material in the form of the silicon/carbon alloy 109. On the other hand, if shallow drain and source extensions are required, an in situ doping during the deposition process 108 may have to be delayed until a final phase of the deposition process 108, thereby, however, also resulting in a significant lateral offset of the corresponding in situ doped silicon/carbon material. For example, as shown in FIG. 1b, it may be assumed that at a deposition phase corresponding to the layer 109N, an appropriate precursor material comprising an N-type dopant species may be introduced into the deposition ambient of the process 108. Consequently, a lateral offset 109Z may be obtained for the highly doped silicon/carbon material 109 starting from the "layer" 109N, which may substantially correspond to the desired depth of a corresponding shallow drain and source extension region. On the other hand, positioning the shallow in situ doped material 109N closer to the channel region 106 may require the cavities 104 to be formed with a reduced depth, which on the other hand may result in a reduced amount of strain-inducing material and thus in a reduced strain component in the channel region 106. In some conventional approaches, the silicon/carbon material 109 may be provided in a substantially non-doped form and the corresponding shallow drain and source regions may be formed by ion implantation, thereby, however, providing a significant strain relaxation in the shallow drain and source regions, which may thus also result in a reduced overall strain component.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and transistor devices in which a semiconductor alloy may be formed in the drain and source regions down to a desired depth for enhancing overall strain in the adjacent channel region while nevertheless enabling an in situ doping of shallow drain and source regions. For this purpose, the deposition of the semiconductor alloy, such as silicon/carbon material, may be controlled such that a reduced growth rate may be accomplished in the lateral direction, thereby obtaining a fill behavior corresponding to a "bottom to top" fill behavior. Consequently, a desired dopant species may be introduced into the deposition ambient in an advanced position phase, which may result in a high desired dopant concentration for defining the shallow drain and source regions, while nevertheless the overall depth of the cavity and thus of the amount of strain-inducing material may be selected independently from the vertical extension of the shallow drain and source regions. Consequently, the strain relaxing effect of ion implantation processes for defining shallow drain and source regions of conventional approaches may be avoided, while the vertical extension of the strain-inducing semiconductor alloy may be selected on the basis of strain related aspects. In some illustrative aspects, a silicon/carbon semiconductor alloy may be used, thereby significantly enhancing overall device performance of N-channel transistors.

One illustrative method disclosed herein comprises forming cavities adjacent to a gate electrode structure in an active region of a transistor, wherein the cavities have a sidewall surface and a bottom surface. The method further comprises performing a selective epitaxial growth process for filling a semiconductor alloy in the cavities, wherein the epitaxial growth process has a first growth rate corresponding to the sidewall surface and a second growth rate corresponding to the bottom surface and wherein the first growth rate is less than the second growth rate. Additionally, the method comprises introducing a dopant species into a deposition ambient of the epitaxial growth process after filling in a first amount of the semiconductor alloy so as to form shallow drain and source regions.

A further illustrative method disclosed herein comprises forming cavities in an active region adjacent to a gate electrode structure to a first depth by a first anisotropic etch process. The method further comprises modifying a surface layer at least at a side surface of the cavities and deepening the cavities so as to extend to a second depth by performing a second anisotropic etch process. Additionally, the cavities are filled with a semiconductor alloy by performing a selective epitaxial growth process. Finally, the method comprises introducing a dopant species into a deposition ambient of the epitaxial growth process at an advanced phase of the epitaxial growth process to form shallow drain and source regions.

One illustrative field effect transistor disclosed herein comprises first carbon-containing strain-inducing regions located laterally adjacent to a silicon-containing channel region and extending to a first depth. The first carbon-containing strain-inducing regions comprise an N-type dopant species so as to form at least a portion of shallow drain and source regions. Additionally, the field effect transistor comprises second carbon-containing strain-inducing regions located laterally adjacent to the silicon-containing channel region and extending from the first depth to a second depth. Moreover, deep drain and source regions are formed adjacent to the first and second strain-inducing regions and a gate electrode is formed above the channel region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques and field effect transistors in which a semiconductor alloy, such as a silicon/carbon alloy, may be provided in "deep" cavities adjacent to a gate electrode structure, wherein an upper portion of the semiconductor alloy may include a dopant species so as to form shallow drain and source regions, wherein, however, contrary to conventional strategies, a lateral offset of the shallow drain and source regions may be substantially defined by a lateral offset of the cavity. For this purpose, in some illustrative aspects disclosed herein, sophisticated selective epitaxial growth techniques may be used, which may provide a substantially "bottom to top" fill behavior so that a lateral offset of the grown semiconductor alloy may not significantly depend on deposition time. That is, a dopant species may be introduced into the deposition ambient at any appropriate time during the deposition process, since the width of a cavity along the length direction of the transistor may not have been reduced during the preceding deposition phase. Consequently, the in situ doped semiconductor alloy may be positioned close to the channel region, wherein deposition is substantially defined by the lateral offset of the initial cavity, while the depth and the concentration of a dopant species may be controlled by the concentration of the corresponding dopant species containing precursor material and the point in time of supplying the dopant species to the deposition ambient. Consequently, an efficient decoupling of the depth of the cavity and thus the amount of strain-inducing semiconductor alloy and the characteristics of the shallow drain and source regions, i.e., the depth thereof and the dopant concentration, may be achieved on the basis of a cyclic selective epitaxial growth process.

In other illustrative embodiments, the growth rate at exposed surface portions of the cavities may be adjusted on the basis of a selective modification of surface characteristics, for instance by selectively providing a surface at an upper portion of sidewall faces of the cavity in order to significantly reduce the lateral growth rate, so that the lateral width of the cavities may be maintained at least in the upper portion thereof prior to filling in an in situ doped semiconductor alloy. For example, a corresponding selective modification of surface characteristics may be achieved by oxidation, nitridation, plasma-based treatments, ion implantation and the like. Hence, also in this case, the characteristics of the in situ doped shallow drain and source regions may be decoupled, at least to a significant degree, from the depth of the cavities and thus of the semiconductor alloy to be formed therein, thereby also providing an efficient strain-inducing mechanism while enabling the provision of shallow in situ doped drain and source regions, which may be highly advantageous in the context of using a silicon/carbon alloy, as previously explained.

With reference to FIGS. 2a-2h and 3a-3g, further illustrative embodiments will now be described in more detail, wherein FIGS. 1a-1b may also be referred to when appropriate.

Figure 2A:
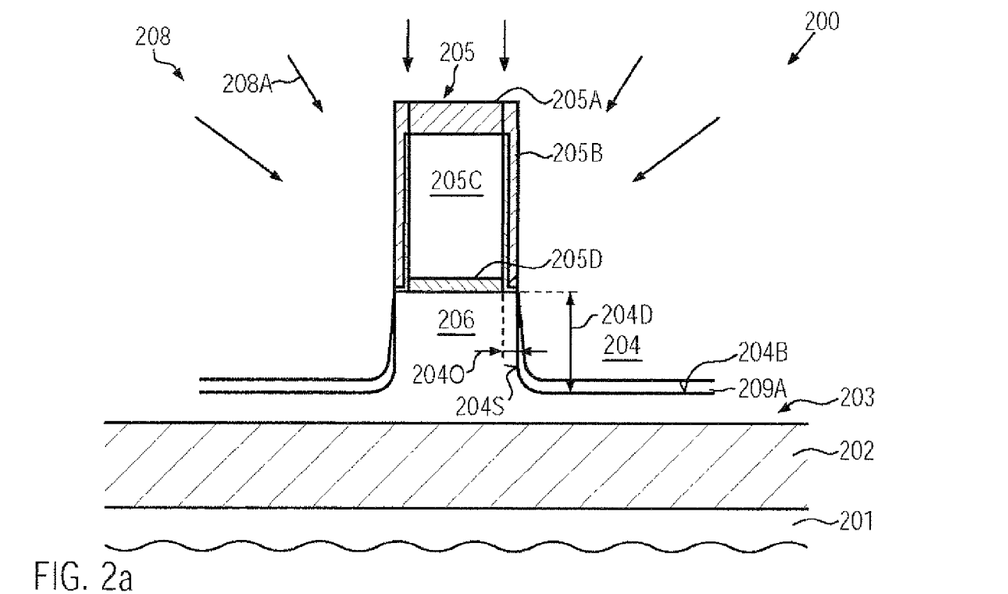
FIGS. 2a-2h schematically illustrate cross-sectional views of a field effect transistor during various manufacturing stages when forming in situ doped shallow drain and source regions in a deep cavity by selective epitaxial growth techniques using a plurality of growth/etch cycles in an ultra-high vacuum ambient according to illustrative embodiments.

FIG. 2a schematically illustrates a cross-sectional view of a transistor 200 comprising a substrate 201 above which may be formed a semiconductor layer 203, such as a silicon-based layer. The substrate 201 may represent any appropriate carrier material for forming thereabove the semiconductor layer 203, such as a semiconductor substrate, a semiconductor substrate including an insulating material, at least in certain device regions, and the like. For example, as shown in FIG. 2a, the transistor 200 may represent a silicon-on-insulator (SOI) transistor in which a buried insulating layer 202, for instance comprised of silicon dioxide, silicon nitride and the like, may be formed between the substrate 201 and the semiconductor layer 203. It should be appreciated that, in other illustrative embodiments, the buried insulating layer 202 may be omitted, at least at certain device regions, when an SOI configuration is considered inappropriate for the overall performance of a semiconductor device including a plurality of transistors. Furthermore, in the manufacturing stage shown, the transistor 200 may comprise a gate electrode structure 205 which may include a gate electrode material 205C formed on a gate insulation layer 205D, which separates the gate electrode material 205C from a silicon-containing channel region 206. It should be appreciated that the gate electrode material 205C may represent any appropriate material, such as polysilicon and the like, as may be required for the further processing of the device 200. In other cases, at least a portion of the gate electrode material 205C may be removed in a later manufacturing stage, depending on the overall process and device requirements. Similarly, the gate insulation layer 205D may be comprised of dielectric materials, such as silicon dioxide, silicon nitride, silicon oxynitride, high-k dielectric materials and the like. A high-k dielectric material is to be understood as a dielectric material having a dielectric constant of 10.0 or higher. Appropriate high-k dielectric materials may be hafnium oxide, zirconium oxide and the like. Also, in this case, the gate insulation layer 205D may be, at least partially, removed in a later manufacturing stage and may be replaced by any other material, such as a high-k dielectric material and the like.

Furthermore, the gate electrode structure 205 may comprise a cap layer 205A comprised of any appropriate dielectric material, such as silicon nitride, silicon dioxide and the like. Furthermore, a spacer structure 205B may be formed on sidewalls of the gate electrode material 205C, wherein any appropriate configuration, such as an etch stop liner in combination with the actual spacer material, may be provided. It should be appreciated that the transistor 200 may have a gate length, i.e., the horizontal extension of the gate electrode material 205C in FIG. 2a, of approximately 50 nm and less, such as approximately 30 nm and less, if advanced integrated circuits, such as microprocessors and the like, are considered.

Furthermore, in the manufacturing stage shown, cavities 204 may be formed in the semiconductor layer 203 laterally adjacent to the gate electrode structure 205, wherein a depth 204D of the cavities 204 may be selected in accordance with requirements concerning the desired amount of strain-inducing semiconductor alloy to be formed in the cavities 204. That is, as previously discussed, in view of obtaining a desired high strain component in the adjacent channel region 206, the depth 204D is selected so as to extend along a significant portion of the thickness of the semiconductor layer 203 wherein, however, a certain amount of template material may be provided at a bottom surface 204B of the cavities 204. On the other hand, a lateral offset 204O of a sidewall surface 204S with respect to a gate electrode material 204C may be defined by the total width of the spacer structure 205B and may be selected in such a manner that an efficient strain transfer mechanism may be obtained and also a desired distance for providing an in situ doped semiconductor material may be accomplished. Moreover, the transistor device 200 may be exposed to a deposition ambient 208A of a selective epitaxial growth process 208 for forming a semiconductor alloy, such as a silicon carbon alloy, within the cavities 204. The deposition ambient 208A may correspond to an early phase of the deposition sequence 208, thereby forming a first layer 209A of a semiconductor alloy, such as a silicon carbon material.

The transistor 200 as shown in FIG. 2a may be formed on the basis of substantially the same process techniques as previously described with reference to the transistor 100. That is, after patterning the gate electrode structure 205 including the spacer structure 205B, the cavities 204 may be formed by an appropriate anisotropic etch process using well-established process parameters, as previously discussed. After appropriate cleaning processes, the deposition ambient 208A may be established which, in some illustrative embodiments, may be accomplished by using an ultra-high vacuum (UHV) ambient with a gaseous atmosphere including a reducible precursor material in combination with a reducing gas. For example, the reducible gas component may comprise any appropriate precursor material including the semiconductor species of interest. For instance, silicon and carbon may be deposited and may be provided in the form of a reducible gas component, such as gas components including chlorine, bromide and the like which may be reduced in the presence of hydrogen. Consequently, during the deposition step 208A, the semiconductor alloy, such as silicon and carbon, may be deposited, preferably on exposed crystalline surface areas of the cavities 204, thereby forming the material layer 209A. It should be appreciated that other combinations of a reducible gas and a reducing gas may be used, depending on the overall process strategy. Furthermore, during the deposition step 208A, the substrate temperature of the device 200 may be adjusted to a moderately "low" temperature, such as approximately 700° C. and less, which may be considered in the context of a selective epitaxial growth process as a low temperature. For example, the substrate temperature may be adjusted to approximately 500-700° C. Furthermore, the gas flow rates of the reducing gas and the reducible gas may be adjusted in a proportion so as to obtain a desired fraction in the semiconductor alloy, for instance a silicon/carbon alloy may be deposited with a fraction of approximately 1-5 atomic percent carbon while in other cases an even higher concentration of carbon may be provided. By appropriately adjusting the ratio of the reducible gas components, for instance one gas component resulting in the deposition of carbon and one gas component resulting in the deposition of silicon for the case of a silicon/carbon material, the desired degree of lattice mismatch between the material 209A and the remaining template material of the layer 203 may be adjusted. It should be appreciated that the fraction of non-silicon atoms within the semiconductor alloy may be varied, if considered appropriate. Furthermore, the pressure in the ultra-high vacuum ambient of the deposition step 208A may be adjusted to approximately one to several hundred milli Torr depending on the values of the other process parameters, such as temperature and overall gas fuel rates. The deposition ambient of the deposition step 208A may be maintained for approximately 1-30 seconds and thereafter an etch step may be performed to preferably remove material from the sidewall surface 204S.

Figure 2B:
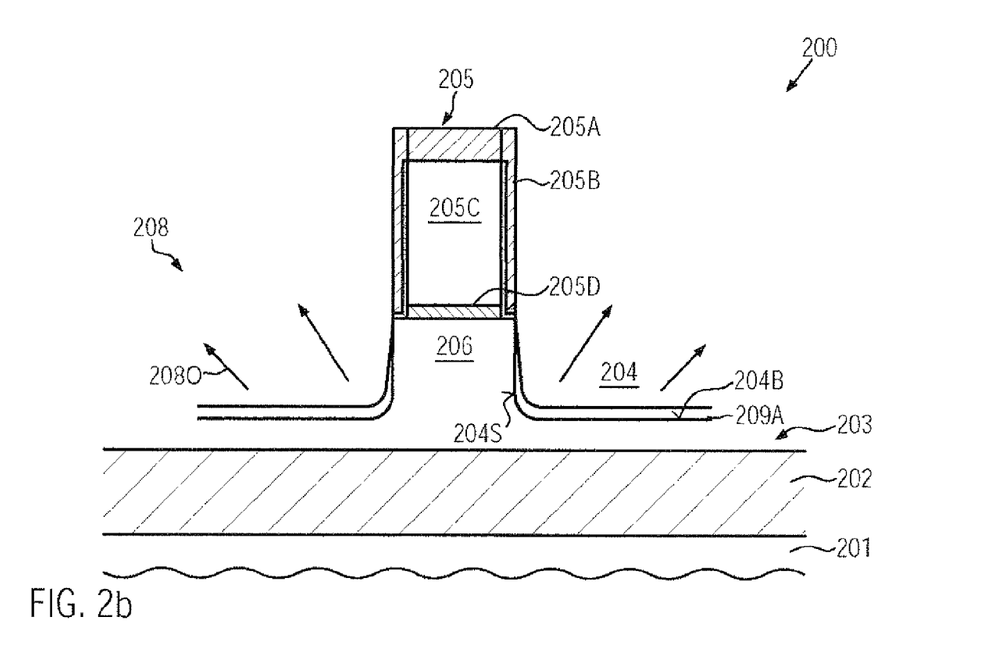

FIG. 2b schematically illustrates the transistor 200 during an etch step 208O of the cyclic deposition sequence 208. In some illustrative embodiments, the etch step 208O may be established on the basis of substantially the same process parameters as used during the preceding deposition step 208A, except for a discontinuation of the reducing gas component. For example, if hydrogen is used as a reducing gas component, the supply thereof may be discontinued during the step 208O, thereby initiating a material removal since the reducible gas that may be in contact with the material 209A may react to form a gas component which may be discharged from the ambient 208O, thereby removing material preferably at the sidewall surface 204S. Consequently, after an "etch time" of approximately one to several seconds, a thickness of the material 209A at the sidewall surface 204S may be significantly reduced, while a corresponding material removal above the horizontal surface portion 204B may be less pronounced. Consequently, after the etch step 208O, the material layer 209A may be substantially formed above the top surface 204B, since a "vertical" growth rate of the combined processes 208A, 208O may be higher compared to the corresponding "horizontal" growth rate.

Furthermore, during the preceding or the subsequent deposition, the process parameters may result in a different deposition rate between the sidewall surfaces 204S and the bottom face, thereby also contributing to the desired growth behavior. For example, the different crystallographic orientation of the sidewall surfaces 204S and the surface 204B, i.e., a (100) plane versus a (110) plane in case of a standard crystallographic configuration of the semiconductor layer 202, may result in different growth rates. Moreover, under UHV conditions, the gases are not supplied in the form of a laminar flow, such is in low pressure chemical vapor deposition (CVD) processes, but the gases are supplied, due to the extreme pressure, as a molecular "flow," which may also result in different growth rates.

Figure 2C:
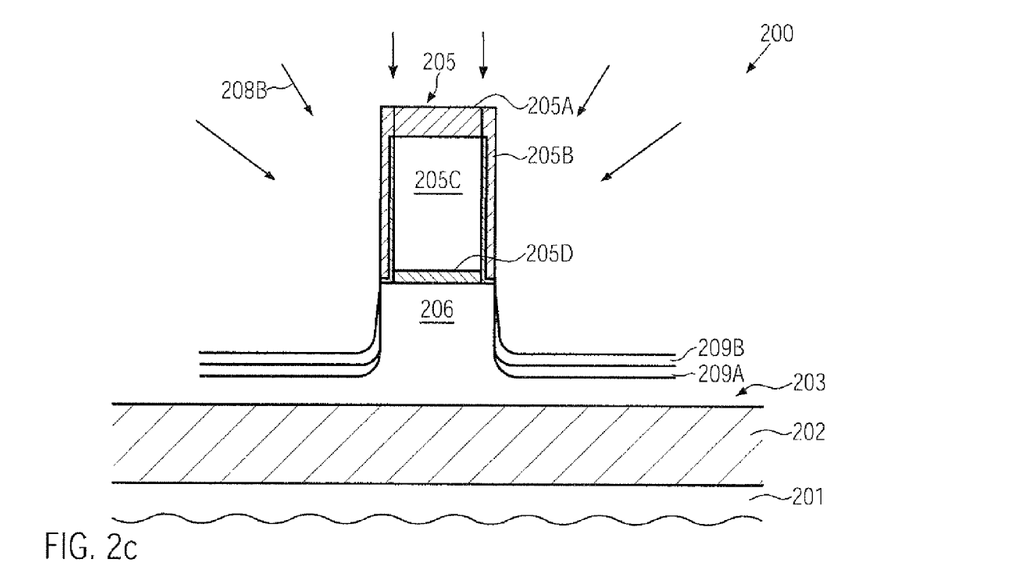

FIG. 2c schematically illustrates the transistor 200 during a further deposition step 208B, which may be performed under similar conditions as the step 208A. For example, the reducing gas component, the supply of which may have been discontinued during the etch step 208O, may again be supplied to the deposition ambient, thereby resulting in the deposition of a further layer 209B.

Figure 2D:
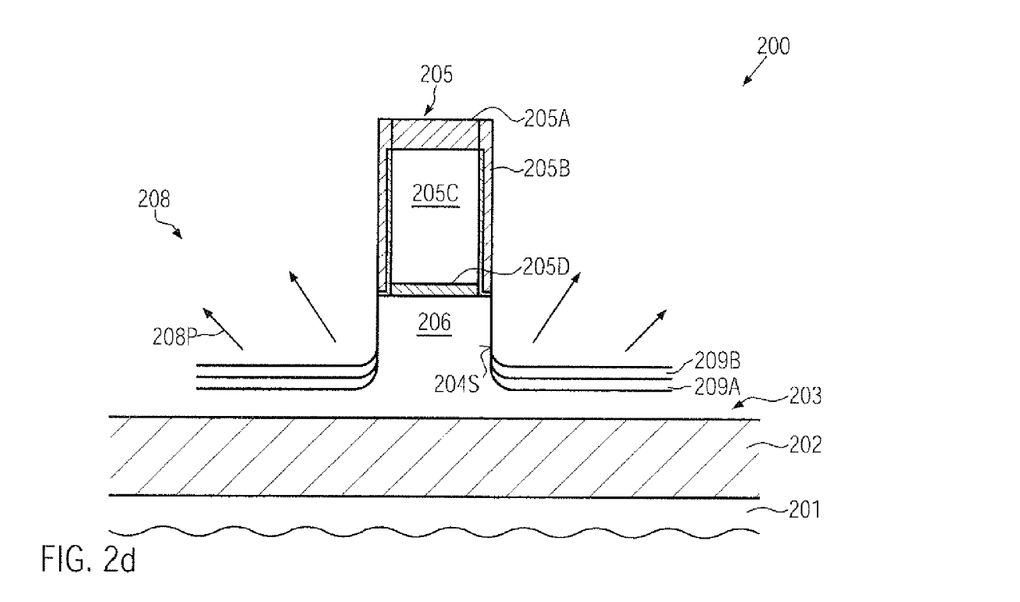

FIG. 2d schematically illustrates the transistor 200 during a further etch step 208P designed to preferably remove material from the sidewall surface 204S, as previously explained. The sequence 208 may comprise a plurality of growth and etch cycles, such as the growth/etch cycle 208A, 208O and the growth/etch cycle 208B, 208P, so as to increasingly fill the cavity 204 in a "bottom to top" manner.

Figure 2E:
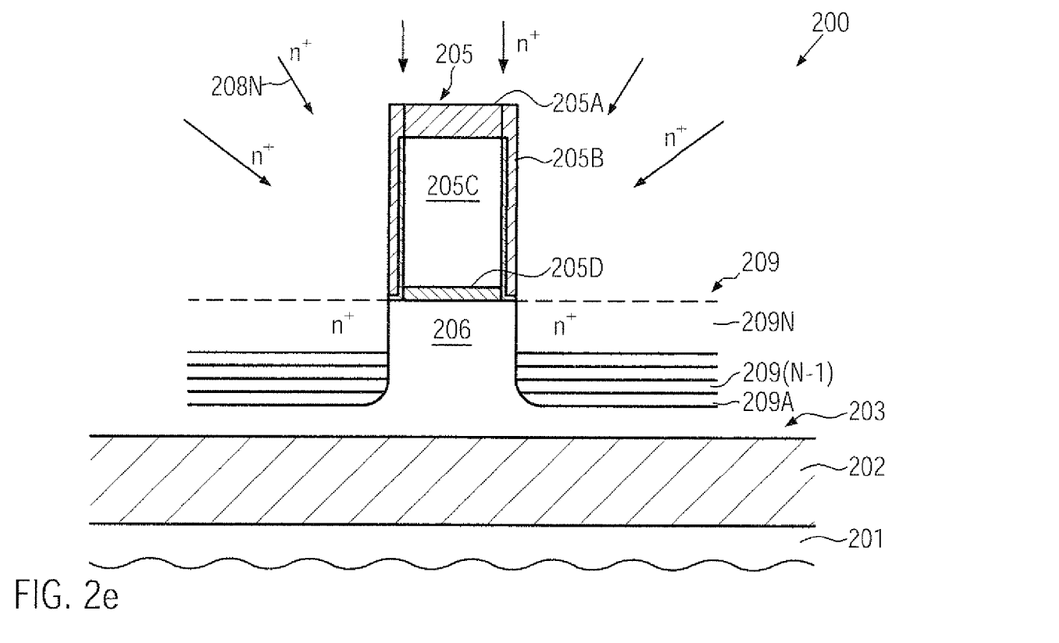

FIG. 2e schematically illustrates the transistor 200 during a final phase 208N of the cyclic deposition process 208 in which, after providing a material layer 209(N-1), an appropriate dopant species may be incorporated into the deposition ambient in order to provide the semiconductor alloy 209N so as to be in situ doped as may be required for forming shallow drain and source regions. For instance, in the embodiment shown, an N-type dopant species may be incorporated into the deposition ambient of the process 208N in order to obtain a high N-doping down to a depth as defined by the previously formed materials 209A . . . 209(N-1), which may be provided as a substantially non-doped semiconductor alloy or in which any appropriate dopant species may be incorporated in accordance with device requirements. For example, one or more of the layers 209A . . . 209(N-1) may include a certain amount of counter dopant species in order to adjust the overall characteristics of drain and source regions still to be formed. It should be appreciated that the deposition step 208N may represent the last step of the sequence 208, since a further "bottom to top" behavior may no longer be required. In other cases, the in situ doped material 209N may also be provided in the form of two or more growth/etch cycles, if deemed appropriate. Furthermore, the dopant concentration may be varied over deposition time, if desired. Thus, after the deposition step 208N, a high dopant concentration may be positioned close to the channel region 206 while a thickness of the in situ doped material 209N and thus the depth of the dopant concentration may correspond to the further processing of the device 200 in view of forming shallow drain and source regions.

Figure 2F:
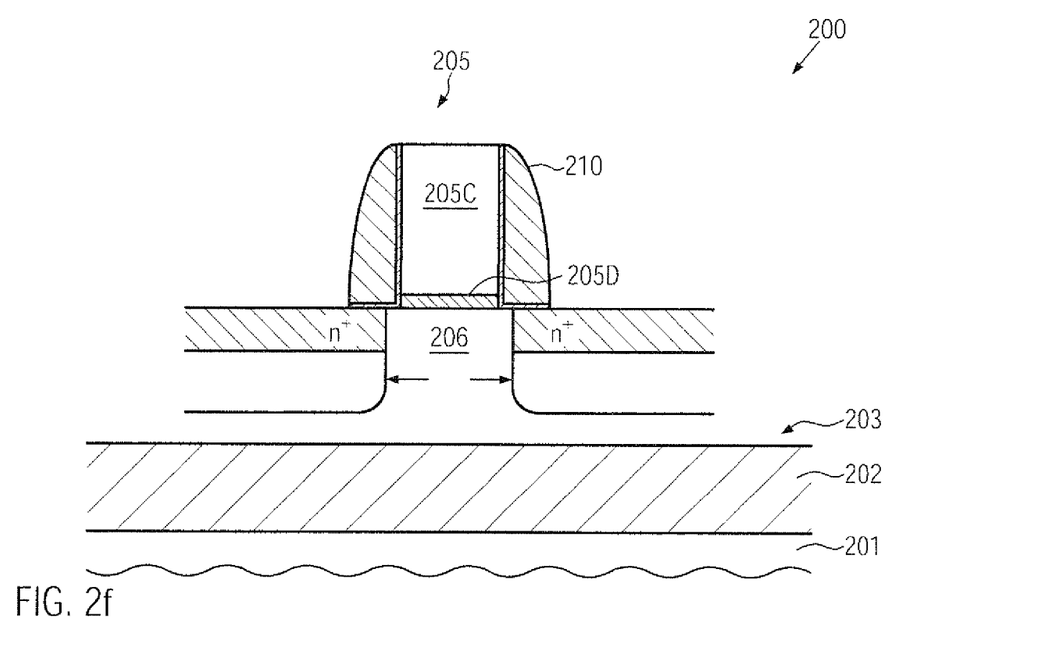

FIG. 2f schematically illustrates the transistor 200 in a further advanced manufacturing stage. As shown, a spacer structure 210 may be formed on sidewalls of the gate electrode structure 205, which may be accomplished by removing the spacer structure 205B and the cap layer 205A (FIG. 2e), which may involve the application of well-established selective etch techniques. Thereafter, well-established spacer techniques may be used, for instance, by depositing a liner material in combination with a spacer material and patterning the spacer material by anisotropic etch techniques. Hence, the width of the spacer structure 210 may be appropriately selected so as to conform with further processing of the transistor 200, for instance with respect to forming deep drain and source areas, possibly in combination with forming metal silicide regions in a later manufacturing stage. It should be appreciated that the spacer structure 210 may be formed in several steps, if a more pronounced lateral profile of the deep drain and source areas is required.

Figure 2G:
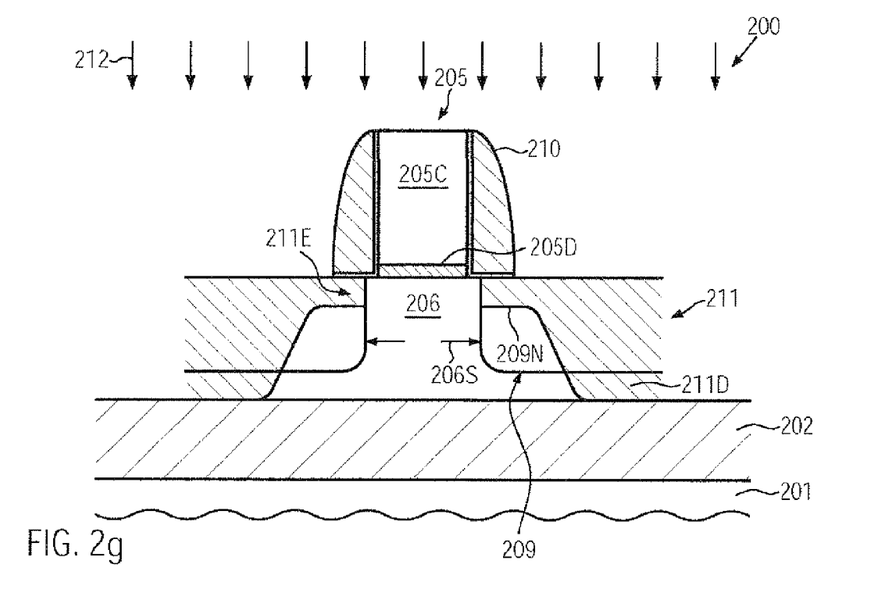

FIG. 2g schematically illustrates the transistor 200 during an ion implantation process 212 designed to form deep drain and source regions 211D of drain and source regions 211. For this purpose, appropriate implantation parameters may be selected to obtain the desired concentration and depth of the deep drain and source regions 211D, while the in situ doped and substantially crystalline material 209N may be protected by the spacer structure 210. Thus, after the implantation process 212, the drain and source regions 211 may comprise shallow drain and source regions, also referred to as extension regions 211E, which may be in a substantially crystalline state and may have incorporated therein a moderately high dopant concentration, while at the same time inducing a desired strain component 206S in the channel region 206. Furthermore, the drain and source regions 211 may comprise the deep drain and source regions 211D in a highly damaged state due to the preceding implantation process 212. On the other hand, the remaining material 209, which may be provided in a substantially non-doped state or which may have incorporated therein a certain degree of counter doping, depending on the overall device requirements, may also provide an efficient strain-inducing mechanism into the adjacent channel region 206.

Figure 2H:
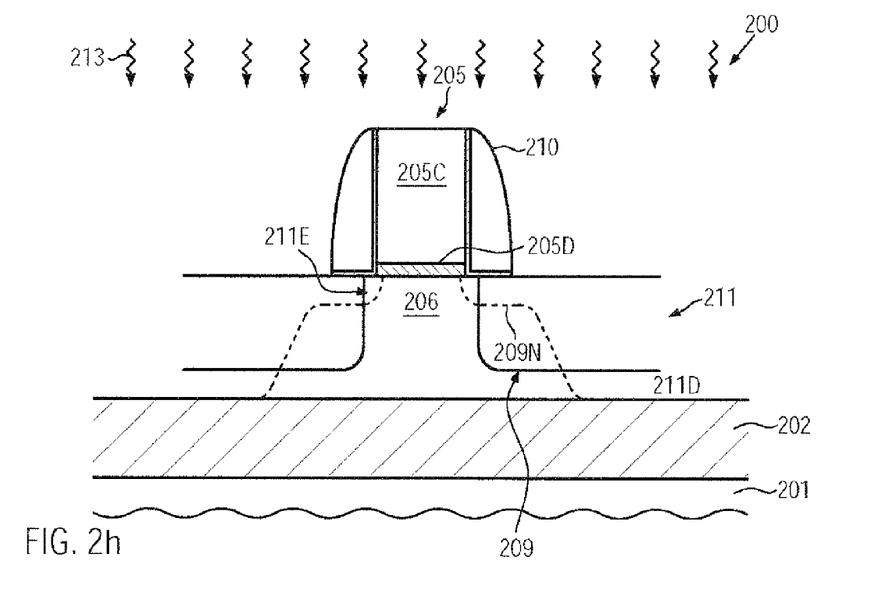

FIG. 2h schematically illustrates the transistor 200 in a further advanced manufacturing stage, in which an annealing process 213 may be performed to re-crystallize the heavily damaged deep drain and source regions 211D. The process parameters of the anneal process 213 may be selected to obtain the desired final dopant profile for the drain and source regions 211. That is, if a certain degree of thermal diffusion is desired, for instance for adjusting the effective channel length, dopant species contained in the in situ doped semiconductor alloy 209N may diffuse laterally and vertically, as indicated by the dashed line. Consequently, the extension regions 211E may "move" towards the channel region 206, thereby adjusting the final effective channel length. In other cases, if a significant dopant diffusion during the anneal process 213 may not be desired, appropriate anneal techniques, such as flashlight-based anneal processes and laser-based anneal techniques, may be employed in which the effective anneal time is very short, thereby suppressing any pronounced diffusion activity while nevertheless enabling a desired re-crystallization of the heavily damaged deep drain and source regions 211D. In other illustrative embodiments, the diffusion of the extension regions 211E may be adjusted independently from a diffusion of the deep drain and source regions 211D, for instance by performing an appropriate anneal process prior to the implantation process 212 (FIG. 2g) in order to adjust the desired shape and size of the extension regions 211E, while the anneal process 213 may be performed on the basis of techniques that substantially suppress any thermal diffusion, thereby substantially maintaining the size and shape of the deep drain and source regions 211D, as obtained during the implantation process 212. In any case, the in situ doped material 209N and the remaining material 209, which may be positioned below the spacer structure 210, may provide the desired high strain component, for instance in the form of a tensile strain component, when a silicon/carbon material may be provided in the regions 209N, 209, while at the same time shallow drain and source extension regions 211E may be obtained on the basis of in situ doping.

With reference to FIGS. 3a-3g, further illustrative embodiments will now be described in which a surface modification of an upper sidewall portion of the cavities may result in a desired "bottom to top" fill behavior during the epitaxial growth process.

Figure 3A:
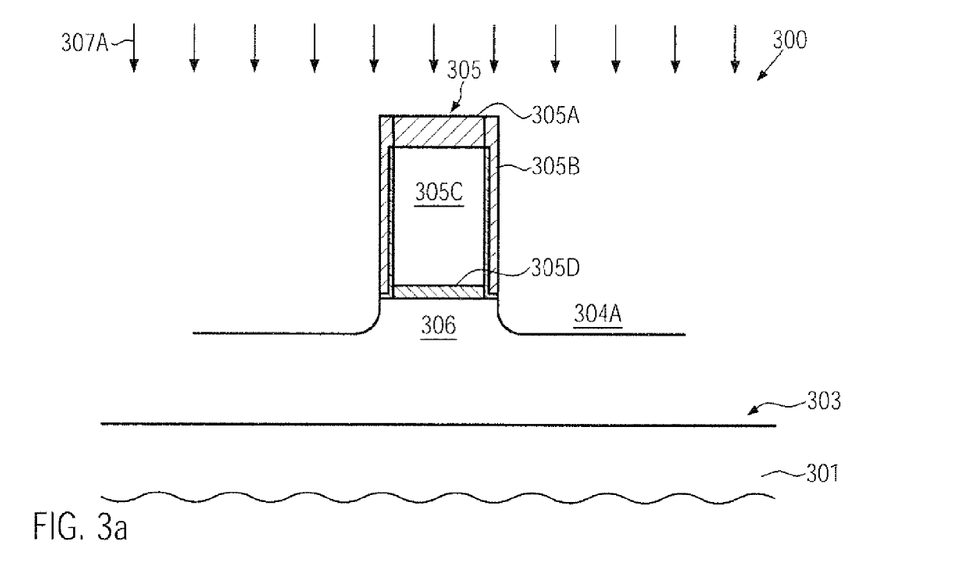
FIGS. 3a-3g schematically illustrate a field effect transistor during various manufacturing stages in forming in situ doped shallow drain and source regions in a deep cavity by selective epitaxial growth techniques on the basis of a modified side surface portion of the cavities according to still other illustrative embodiments.

FIG. 3a schematically illustrates a cross-sectional view of a transistor 300 comprising a substrate 301 above which may be formed a semiconductor layer, such as a silicon-based layer 303. Furthermore, a gate electrode structure 305 may be formed on the semiconductor layer 303. For the components described so far, the same criteria may apply as previously explained with reference to the transistors 100 and 200. Furthermore, the transistor 300 may be exposed to a first etch ambient 307A that is designed to form cavities 304A adjacent to the gate electrode structure 305. That is, the etch process 307A may be performed on the basis of well-established anisotropic etch techniques wherein, however, a depth of the cavities 304A may be selected so as to substantially correspond to the depth at which an in situ doped semiconductor alloy is to be formed in a later manufacturing stage.

Figure 3B:
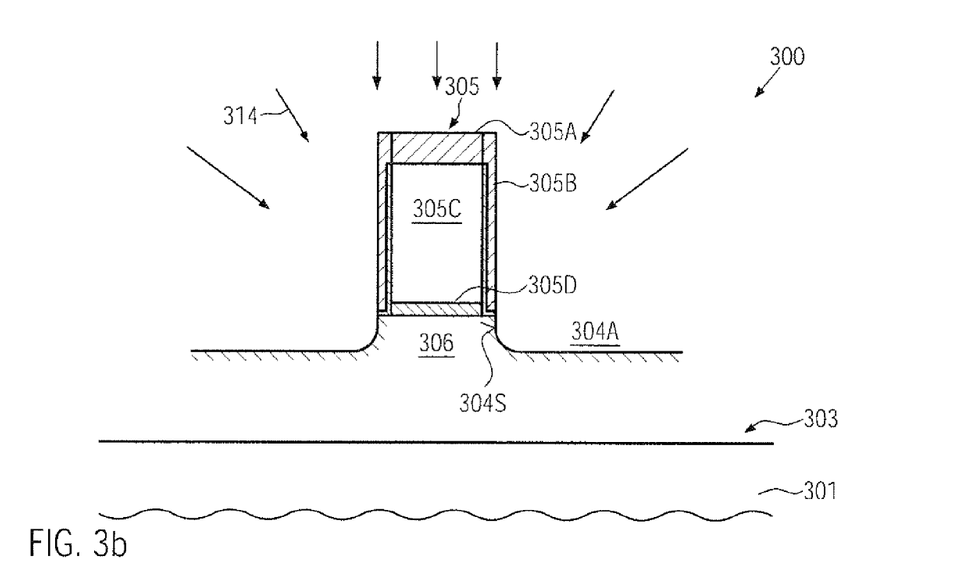

FIG. 3b schematically illustrates the transistor 300 during a process 314 that is designed to at least modify a side surface 304S of the cavities 304A. For example, the process 314 may comprise an ion implantation process designed to significantly damage the crystalline structure of exposed surface portions of the cavities 304A, for instance by ion bombardment with xenon, silicon, germanium and the like. For this purpose, an appropriate tilt angle may be selected, i.e., a non-zero angle with respect to a surface norm of the semiconductor layer 303. In other illustrative embodiments, the treatment 314 may comprise an ion bombardment on the basis of a plasma ambient, thereby also creating a specific degree of crystalline damage which may alter the growth behavior during a subsequent selective epitaxial growth process.

Figure 3C:
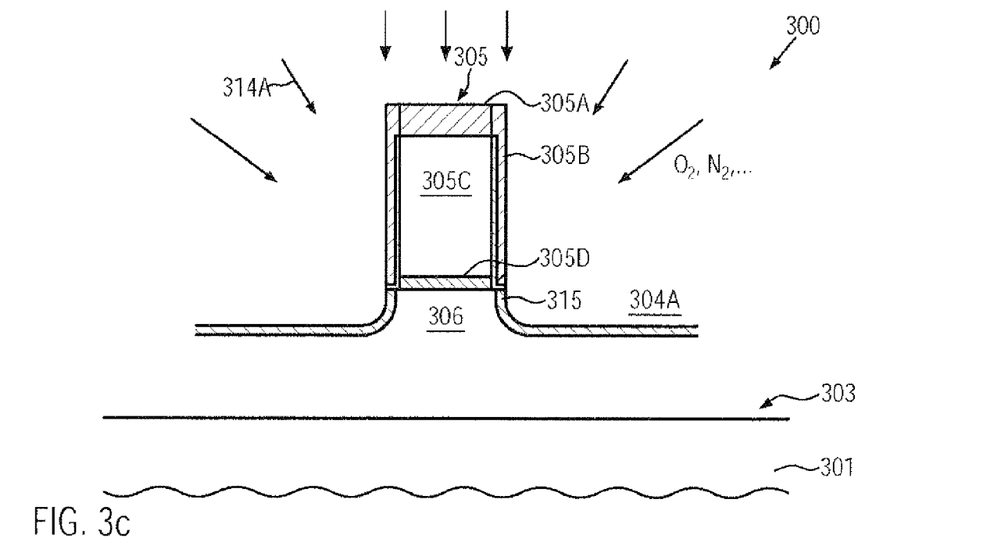

FIG. 3c schematically illustrates the transistor 300 according to other illustrative embodiments in which a modification process 314A may be performed to obtain a passivation layer 315 on exposed surface areas of the cavities 304A. For instance, the process 314A may comprise a deposition of an appropriate material, an oxidation process, a nitridation process and the like. For instance, a plurality of wet chemical oxidation techniques may be used, some of which may have a self-limiting behavior, thereby providing a well-defined thickness of the layer 315. In other cases, thermal oxidation processes and plasma induced oxidation processes may be used, possibly in combination with additional components, such as nitrogen and the like. For example, a thickness of the passivation layer 315 may be adjusted on the basis of corresponding process parameters of the process 314A so that an additional degree of freedom may be obtained in adjusting the desired offset of the highly in situ doped material with respect to a gate electrode material 305C of the gate electrode structure 305. That is, the "consumption" of material of the channel region 306 during the process 314A may be advantageously used to determine the position of an in situ doped semiconductor alloy still to be formed in a later manufacturing stage.

Figure 3D:
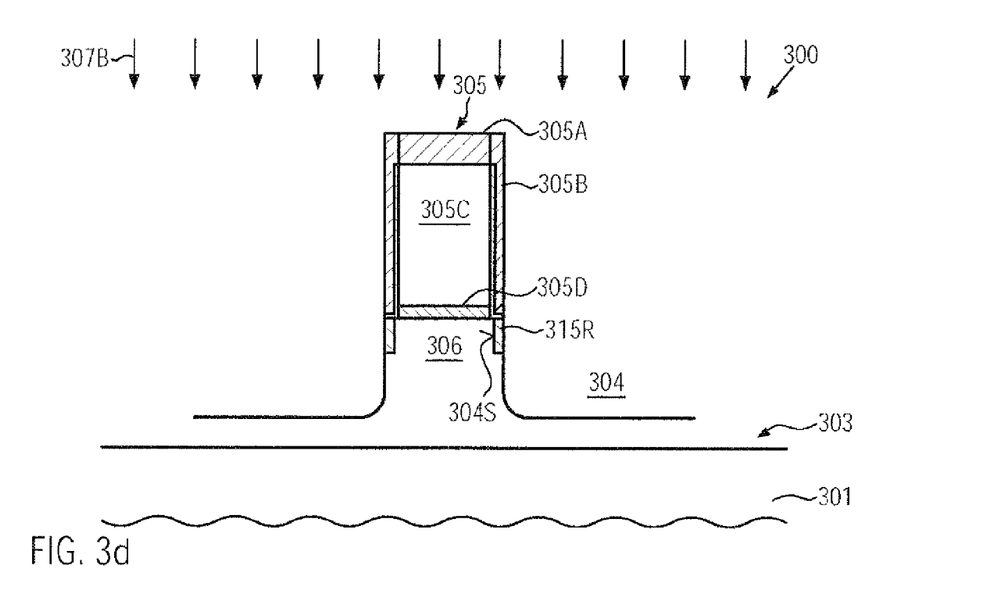

FIG. 3d schematically illustrates the transistor 300 during a further anisotropic etch process 307B to form cavities 304 having a desired overall depth. During the etch process 307B, horizontal portions of the passivation layer 315 may be removed, which may be accomplished by well-established etch recipes. For instance, a substantially non-selective etch chemistry with respect to material of the passivation layer 315 and the semiconductor layer 303 may be used, or an initial step may be performed to etch through the passivation layer 315 in an anisotropic manner. Hence, a residue 315R may still cover the upper sidewall portion 304S.

Figure 3E:
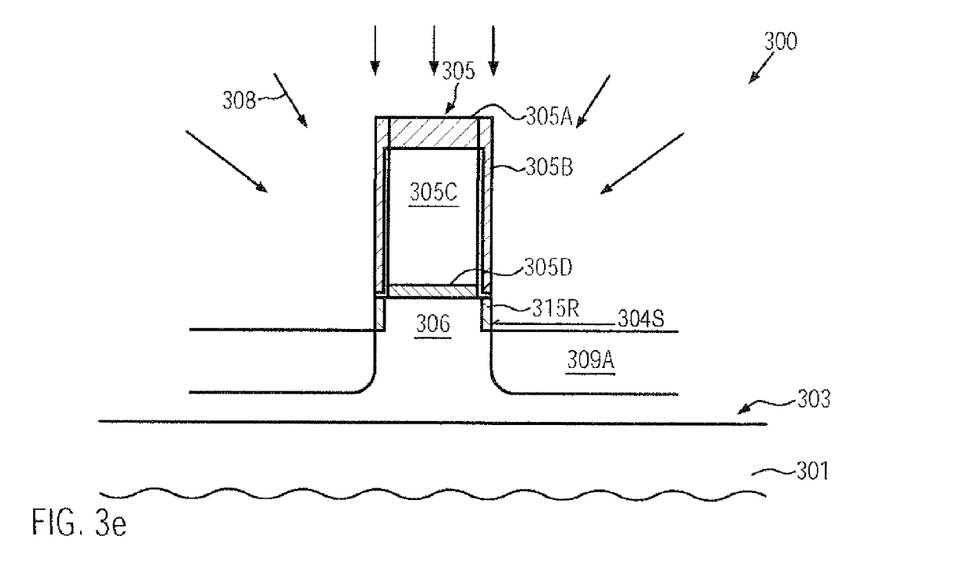

FIG. 3e schematically illustrates the transistor 300 in a further advanced manufacturing stage. As shown, the transistor 300 is exposed to a selective deposition ambient 308 designed to form a substantially non-doped semiconductor alloy 309A or a counter-doped semiconductor alloy, depending on the overall process strategy, wherein conventional selective epitaxial deposition techniques may be used or wherein a cyclic deposition technique may be used, as previously described with reference to the semiconductor device 200. Due to the presence of the material residue 315R, the upper sidewall portion 304S may remain substantially non-covered by the semiconductor material 309A or may have at least a significantly reduced deposition rate.

Figure 3F:
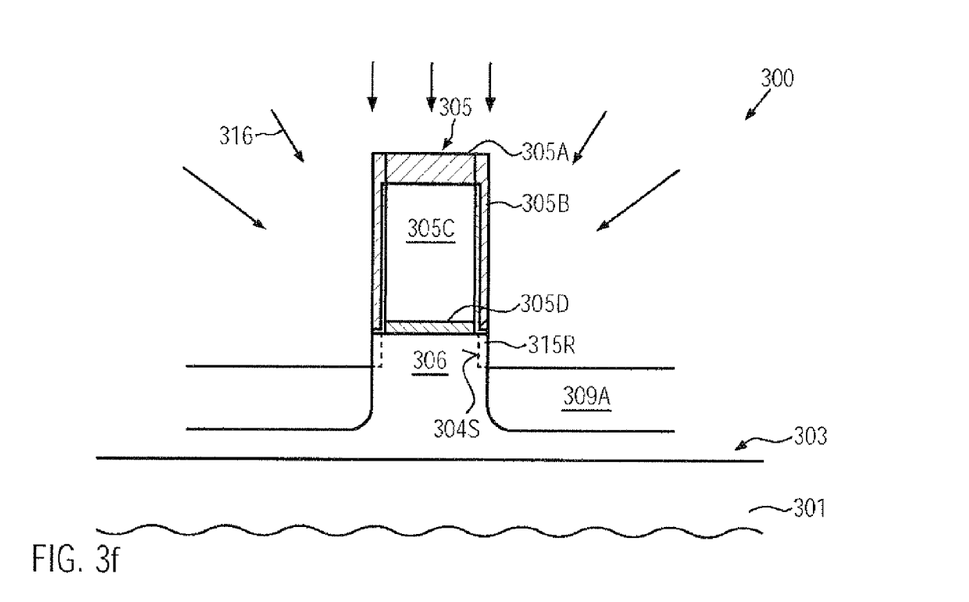

FIG. 3f schematically illustrates the transistor 300 during an etch process 316, which may be performed as an isotropic etch process in order to remove the passivation material 315R to expose the upper sidewall portions 304S. For example, the etch process 316 may be performed on the basis of hydrofluoric acid (HF) when the passivation material 315R is comprised of silicon dioxide. In other cases, any other appropriate etch chemistry may be used, wherein even a non-selective etch chemistry with respect to the material 309A may be used, since only a reduced etch time may be required for completely removing the passivation material 315R.

Figure 3G:
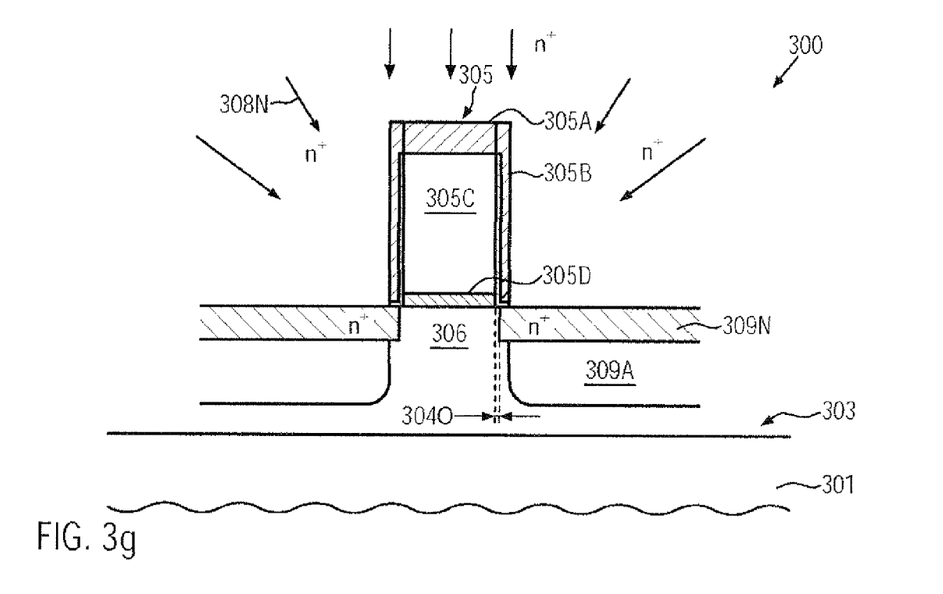

FIG. 3g schematically illustrates the transistor 300 in a further advanced manufacturing stage in which a further selective epitaxial growth step 308N may be performed to deposit a semiconductor alloy 309N including a desired high dopant concentration. Thus, the in situ doped material 309N may be positioned close to the channel region 306, wherein an offset 304O with respect to the gate electrode material 305C may be defined by the previously formed cavity 304A, possibly in combination with an additional material consumption caused by one of the processes 314, 314A (FIGS. 3b, 3c).

Consequently, by providing the passivation material 315R (FIG. 3d), an efficient modification of the growth rate along the channel length direction, i.e., in FIG. 3g, the horizontal direction, may be obtained at least in the upper portion of the cavity 304 during the deposition of the material 309A. Hence, the efficiency of cyclic growth/etch sequences may be enhanced or even conventional selective epitaxial growth techniques may be used during the growth of the material 309A. Thereafter, the passivation material 315R may be removed and the process 308N may be performed, for instance on the basis of well-established conventional deposition techniques to incorporate the dopant species by providing a desired small offset 304O. Thereafter, the further processing may be continued, as is described with reference to the device 200. That is, deep drain and source areas may be formed on the basis of ion implantation using an appropriate sidewall spacer as an implantation mask, thereby avoiding implantation-induced damage of the materials 309N, 309A in the vicinity of the channel region 306, as previously explained.

As a result, the present disclosure provides techniques and transistor devices in which shallow drain and source regions may be formed on the basis of an in situ doped semiconductor alloy, wherein substantially a non-doped or counter-doped portion thereof may extend deep into the semiconductor material, thereby efficiently decoupling the provision of an in situ doped semiconductor alloy for shallow drain and source regions and the efficiency of a strain-inducing mechanism. For example, a silicon/carbon semiconductor alloy may be formed in a moderately deep cavity, while an in situ doped portion may be provided in close proximity to the channel region, which may be accomplished by appropriately modifying the effective growth rate corresponding to the sidewall surface and the bottom surface during the filling in of the semiconductor alloy. For example, a cyclic epitaxial growth process on the basis of low temperatures may be applied, thereby obtaining a significantly reduced horizontal growth rate, which may allow a substantially bottom to top fill behavior. In other illustrative embodiments, a passivation material may be formed on an upper sidewall surface of the corresponding cavities, which may be removed prior to depositing the in situ doped semiconductor alloy in the upper portion of the cavity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a plurality of growth/etch cycles in an ultra-high vacuum state of a deposition ambient for forming a semiconductor alloy in cavities adjacent to a gate electrode structure in an active region of a transistor, said cavities having a sidewall surface and a bottom surface, said growth/etch cycles having a first growth rate corresponding to said sidewall surface and a second growth rate corresponding to said bottom surface, said first growth rate being less than said second growth rate; and
   introducing a dopant species into the deposition ambient during at least one of the plurality of growth/etch cycles to form shallow drain and source regions.

2. The method of claim 1, wherein said plurality of growth/etch cycles are performed at a temperature of approximately 700° C. or less.

3. The method of claim 1, wherein said semiconductor alloy comprises silicon and carbon.

4. The method of claim 3, wherein a growth step of each of said plurality of growth/etch cycles is performed by providing a semiconductor containing precursor gas as a reducible component and a reducing gas to said deposition ambient.

5. The method of claim 4, wherein said reducing gas comprises hydrogen.

6. The method of claim 4, wherein an etch step of each of said growth/etch cycles is performed by discontinuing supply of said reducing gas.

7. The method of claim 1, further comprising forming a spacer structure on sidewalls of said gate electrode structure and forming deep drain and source regions by ion implantation using said spacer structure as an implantation mask.

8. The method of claim 1, wherein a lateral offset of said shallow drain and source regions from a gate electrode material of said gate electrode structure is approximately 5 nm or less.

9. The method of claim 1, wherein said dopant species is an N-type dopant species.

10. A method, comprising:
forming cavities adjacent to a gate electrode structure in an active region of a transistor, said cavities having a sidewall surface and a bottom surface;
performing a selective epitaxial growth process for forming a semiconductor alloy in said cavities, said epitaxial growth process having a first growth rate corresponding to said sidewall surface and a second growth rate corresponding to said bottom surface, said first growth rate being less than said second growth rate; and
introducing a dopant species into a deposition ambient of said epitaxial growth process after forming a first amount of said semiconductor alloy to form shallow drain and source regions, wherein performing said selective epitaxial growth process comprises performing a plurality of growth/etch cycles in an ultra-high vacuum state of said deposition ambient.

11. A method, comprising:
forming cavities adjacent to a gate electrode structure in an active region of a transistor, said cavities having a sidewall surface and a bottom surface;
performing a selective epitaxial growth process for forming a semiconductor alloy in said cavities, said epitaxial growth process having a first growth rate corresponding to said sidewall surface and a second growth rate corresponding to said bottom surface, said first growth rate being less than said second growth rate; and
introducing a dopant species into a deposition ambient of said epitaxial growth process after forming a first amount of said semiconductor alloy to form shallow drain and source regions.

12. The method of claim 10, wherein said plurality of growth/etch cycles are performed at a temperature of approximately 700° C. or less.

13. The method of claim 11, wherein said semiconductor alloy comprises silicon and carbon.

14. The method of claim 10, wherein a growth step of each of said plurality of growth/etch cycles is performed by providing a semiconductor containing precursor gas as a reducible component and a reducing gas to said deposition ambient.

15. The method of claim 14, wherein said reducing gas comprises hydrogen.

16. The method of claim 14, wherein an etch step of each of said growth/etch cycles is performed by discontinuing supply of said reducing gas.

17. The method of claim 11, further comprising forming a spacer structure on sidewalls of said gate electrode structure and forming deep drain and source regions by ion implantation using said spacer structure as an implantation mask.

18. The method of claim 11, wherein a lateral offset of said shallow drain and source regions from a gate electrode material of said gate electrode structure is approximately 5 nm or less.

19. The method of claim 11, wherein said dopant species is an N-type dopant species.

* * * * *